(12) United States Patent
Bierhuizen

(10) Patent No.: US 8,109,644 B2
(45) Date of Patent: Feb. 7, 2012

(54) THIN BACKLIGHT USING LOW PROFILE SIDE EMITTING LEDS

(75) Inventor: Serge Bierhuizen, Santa Rosa, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/760,612

(22) Filed: Apr. 15, 2010

(65) Prior Publication Data

US 2010/0201916 A1 Aug. 12, 2010

Related U.S. Application Data

(62) Division of application No. 11/863,167, filed on Sep. 27, 2007, now abandoned.

(51) Int. Cl.
G09F 13/04 (2006.01)
(52) U.S. Cl. .............. 362/97.3; 362/97.1; 362/249.02; 362/613
(58) Field of Classification Search ............ 362/33, 362/97.1, 97.2, 97.3, 97.4, 244, 245, 246, 362/247, 249.02, 326, 327, 328, 331, 332, 362/341, 342, 346, 355, 554, 555, 558, 605, 362/610, 612, 613, 615, 630, 631, 800, 806, 362/812; 349/57, 58, 59, 61, 62, 64, 65, 349/66, 69, 78, 79, 81
See application file for complete search history.

(56) References Cited

U.S. PATENT DOCUMENTS

| | | | |
|---|---|---|---|
| 3,241,256 A | | 3/1966 | Viret et al. |
| 4,714,983 A | | 12/1987 | Lang |
| 4,754,202 A | * | 6/1988 | Havel ................ 315/169.1 |
| 5,249,104 A | * | 9/1993 | Mizobe ............... 362/605 |
| 6,082,885 A | * | 7/2000 | Belfer ................. 362/554 |
| 6,607,286 B2 | | 8/2003 | West et al. |
| 6,964,489 B2 | * | 11/2005 | Blume et al. ........... 362/27 |
| 6,964,806 B1 | | 11/2005 | Tazaki |
| 6,981,792 B2 | | 1/2006 | Nagakubo et al. |

(Continued)

FOREIGN PATENT DOCUMENTS

EP 1376708 A 1/2004

(Continued)

OTHER PUBLICATIONS

Serge J. Bierhuizen et al, "Optical Element Coupled to Low Profile Side Emitting LED", U.S. Appl. No. 11/840,129, filed Aug. 16, 2007, 27 Pages Including Drawings.

*Primary Examiner* — Hargobind S Sawhney

(57) ABSTRACT

Backlights containing low profile, side-emitting LEDs are described that have improved brightness uniformity. In one embodiment, the backlight comprises a solid transparent lightguide with a plurality of openings in a bottom surface of the lightguide, each opening containing a side-emitting LED. Prisms or other optical features are formed in the top wall of each opening to reflect light in the lightguide towards a light output surface of the lightguide so that the side-emitting LEDs do not appear as dark spots at the output of the backlight. To avoid any direct emission from the sides of the LED toward the output surface of the lightguide appearing as bright areas, optical features are formed at the edges of the opening or in the output surface of the lightguide so that direct emission light is not output from the lightguide. Substantially identical cells may be formed in the lightguide using cellular walls around one or more LEDs.

11 Claims, 8 Drawing Sheets

U.S. PATENT DOCUMENTS

| | | | |
|---|---|---|---|
| 7,052,152 B2 | 5/2006 | Harbers et al. | |
| 7,188,988 B2 | 3/2007 | Koganezawa | |
| 7,261,454 B2 * | 8/2007 | Ng | 362/555 |
| 7,287,891 B1 | 10/2007 | Park et al. | |
| 7,358,686 B2 | 4/2008 | Deurloo | |
| 7,455,429 B2 * | 11/2008 | Barker | 362/290 |
| 7,470,054 B2 * | 12/2008 | Lee | 362/625 |
| 7,641,360 B2 * | 1/2010 | Chou et al. | 362/235 |
| 2004/0151006 A1 * | 8/2004 | Yang | 362/558 |
| 2006/0002146 A1 | 1/2006 | Masatake | |
| 2007/0019394 A1 | 1/2007 | Park et al. | |
| 2007/0183136 A1 | 8/2007 | Park | |
| 2007/0274093 A1 | 11/2007 | Haim et al. | |
| 2008/0019114 A1 | 1/2008 | Stuyven | |
| 2008/0055931 A1 | 3/2008 | Verstraete et al. | |
| 2008/0123367 A1 | 5/2008 | Pan et al. | |

FOREIGN PATENT DOCUMENTS

| | | | |
|---|---|---|---|
| EP | 1640756 A | | 3/2006 |
| JP | 10010997 A | * | 1/1998 |
| WO | 2007087710 A | | 8/2007 |

* cited by examiner

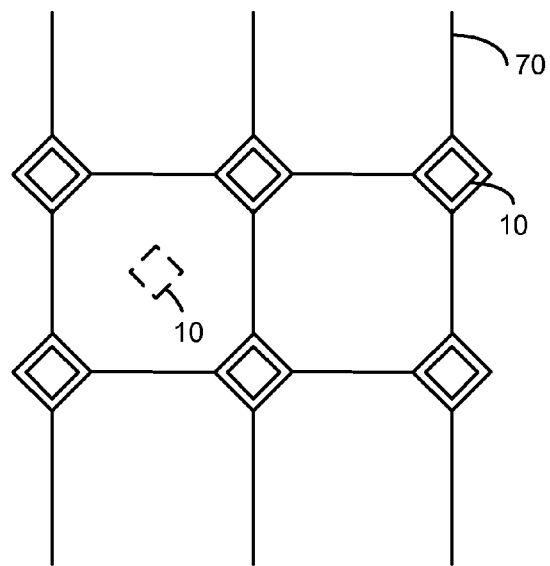
Fig. 9
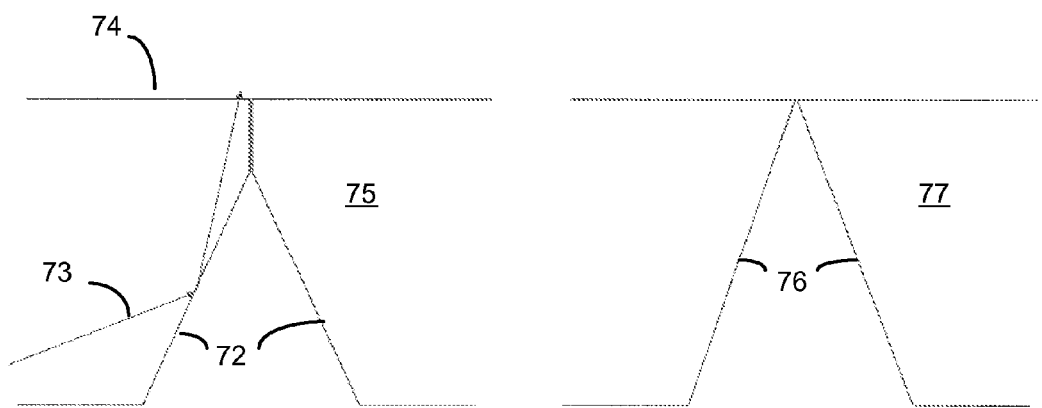
Fig. 10
Fig. 11 ing the thickness typically improves the mixing of light from
THIN BACKLIGHT USING LOW PROFILE SIDE EMITTING LEDS This is a Divisional of prior application Ser. No. 11/863,167 filed Sep. 27, 2007 and is incorporated by reference herein.

FIELD OF INVENTION

This invention relates to backlights using light emitting diodes (LEDs) and, in particular, to techniques for forming thin backlights using side-emitting LEDs.

BACKGROUND

Liquid crystal displays (LCDs) are commonly used in cell phones, personal digital assistants (PDAs), portable music players, laptop computers, desktop monitors, and television applications. One embodiment of the present invention deals with a color or monochrome, transmissive LCD that requires backlighting, where the backlight may use one or more LEDs emitting white or colored light. The LEDs are distinguished from laser diodes in that the LEDs emit incoherent light.

In many small displays, such as for cell phones, it is important that the display and backlight be thin. In such small backlights, one or more LEDs are optically coupled to or near the edges of a solid transparent lightguide (also referred to as a waveguide). Light in the lightguide leaks out a top surface of the lightguide to illuminate a back surface of a liquid crystal display (LCD) panel. In such small backlights, the LCD panel does not overlie the LEDs since the LEDs would appear as a bright spot or, if the LEDs were only side-emitting, the LEDs would appear as a dark spot. Such edge-coupling to a solid lightguide is not practical for a large backlight due to the attenuation of light through the lightguide, making the center area much darker than the edge areas and/or reducing the total efficiency and light output.

For large backlights, such as for televisions, LEDs are typically distributed on the bottom surface of a reflective backlight box. The light from the array of LEDs is mixed in the box, to create a substantially uniform light emission, by the light rays overlapping and the light being reflected off the walls of the box. Such a backlight box is rigid. Large backlight boxes are difficult to handle and are expensive to manufacture.

What is needed is a backlight that can be scaled for large applications, yet does not have the drawbacks of large backlights formed using LEDs within a rigid backlight box.

SUMMARY

Various types of thin side-emitting non-lasing LEDs are described herein for creating a thin, flexible backlight for backlighting an LCD. The LEDs are flip-chips, with the cathode and anode electrodes on the mounting surface of the LED. No wire bonds are used in the preferred embodiment. The LEDs may have a thickness of less than 0.5 mm. The total thickness of an LED and a submount may be less than 1 mm.

The backlight is a solid transparent lightguide, such as a polymer (e.g., PMMA), with an array of the side-emitting LEDs positioned within openings formed in a bottom surface of the lightguide. The bottom surface of the light guide is reflective, by means of a reflective foil formed on the bottom surface or the lightguide being located in a reflective tub. Distributed on the bottom surface of the lightguide are microprisms, or other light scattering features, that reflect light toward a top output surface of the lightguide opposite to the bottom surface.

In order for the side-emitting LEDs to not appear as dark spots at the output of the lightguide, at least one prism (or other light scattering feature) is formed in the lightguide over the LED. The prism forms part of the top surface of the opening for the LED. In such a configuration, the optical properties of the lightguide over the LED are virtually identical to the optical properties elsewhere in the lightguide, so no dark or bright spots are discernable at the output of the backlight.

Some light emitted from the sides of the LED is directed toward the output surface of the lightguide. To prevent such light from appearing as bright areas around the LED, at least one light scattering feature is located at the edges of the opening or on the output surface of the lightguide to prevent such direct light from being output above the LED, which is a much more efficient alternative than absorbing the light with an absorbing material.

The side-emitting LEDs may be mounted on a flexible circuit that interconnects the LEDs, and the transparent lightguide may be made very thin, such as about 1 mm in thickness. Therefore, the backlight may be flexible and can be formed in a continuous roll. The continuous roll may be cut to any size for a particular size LCD.

In one embodiment, the LEDs in a column of LEDs (along a width dimension of the lightguide roll) may be mounted on a flexible circuit that interconnects the LEDs in a column. The ends of the flexible circuit for multiple columns of LEDs may then be coupled together in series and/or parallel and connected to a current supply for energizing the LEDs in the backlight. Such a system could also be used for other applications such as general illumination.

In one embodiment, the lightguide is positioned in a reflective tub when assembling the LCD so that any light escaping from the sides or base surface is redirected back into the lightguide. The reflective tub also provides structural support for the flexible backlight and helps align the LCD panel with respect to the backlight.

In another embodiment, typically for large backlights, the backlight may be up to 10 mm thick and not flexible. Increasing the thickness typically improves the mixing of light from separated LEDs for better color and brightness uniformity across the backlight.

In one embodiment, each LED is identical and emits white light by the use of a blue LED die with a phosphor layer that contributes red and green components.

In one embodiment, the light from various LEDs is mixed in the transparent lightguide.

In another embodiment, each LED is surrounded by specular or diffusing reflecting walls that essentially create a rectangular cell around each LED, so there is limited mixing of the light from multiple LEDs. In one variation, the walls do not extend completely between the top and bottom surfaces of the backlight so as to let light from one cell enter other cells. In another variation, the LEDs are in line with the walls thereby dividing the light between multiple cells. For example, one LED at the corner of four cells may be equally shared by the four cells. In another embodiment, each wall of a cell shares an LED with an adjacent cell, and another LED is in the middle of each cell, thereby providing light from five LEDs for each cell. Any combinations of the embodiments are envisioned.

BRIEF DESCRIPTION OF THE DRAWINGS

FIG. 9 is a top down view of a portion of a backlight illustrating how the LEDs may be positioned at the corners of four cells, in accordance with another embodiment of the invention.

FIG. 10 is a cross-section of the edge of a cell, or segment, and illustrates how the edges of each cell may have angled edges for reflecting light toward the output surface.

FIG. 11 is similar to FIG. 10 and shows a slightly different cell edge.

Elements that are similar or identical in the various figures are labeled with the same numeral.

DETAILED DESCRIPTION

Embodiments of the present invention comprise low profile side-emitting LEDs in conjunction with thin lightguide designs for providing a uniform light emitting surface. A typical application for the invention is as a thin backlight in an LCD or general illumination.

Figure 1A:
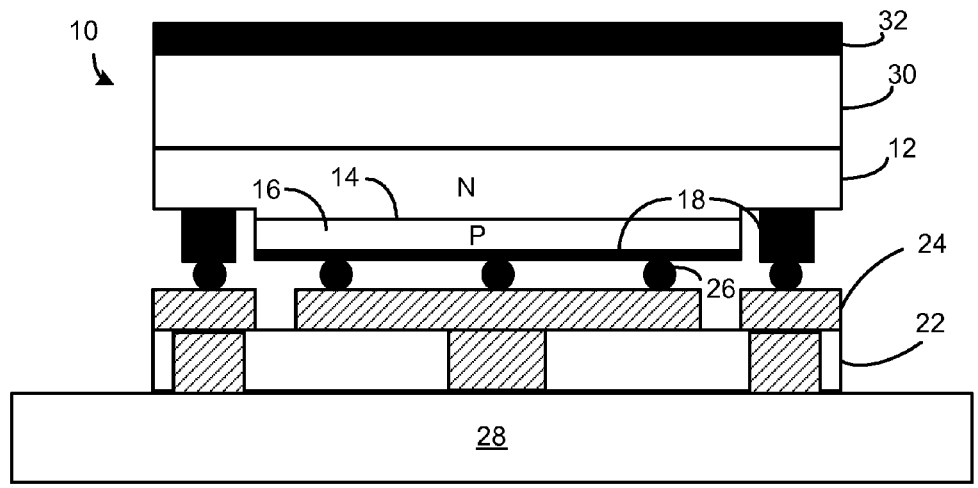
FIG. 1A is a cross-sectional view of a low profile, side-emitting LED in accordance with an embodiment of the invention.

FIG. 1A is a cross-sectional view of one embodiment of a thin, side-emitting LED 10. Other embodiments of thin, side-emitting LEDs that may be used in the backlight embodiments can be found in U.S. application Ser. No. 11/423,419, entitled Low Profile Side Emitting LED, filed Jun. 9, 2006, by Oleg Shchekin et al., assigned to the present assignee, and incorporated herein by reference.

The active layer of the LED 10 in one example generates blue light. LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the active layer (e.g., AlInGaN). Forming such LEDs is well known and need not be described in further detail. Additional detail of forming LEDs is described in U.S. Pat. No. 6,828,596 to Steigerwald et al. and U.S. Pat. No. 6,876,008 to Bhat et al., both assigned to the present assignee and incorporated herein by reference.

The semiconductor LED is then mounted on a submount 22 as a flip chip. The submount 22 contains metal electrodes 24 that are soldered or ultrasonically welded to the metal electrodes 18 on the LED via solder balls 26. Other types of bonding can also be used. The solder balls 26 may be deleted if the electrodes themselves can be ultrasonically welded together.

The submount electrodes 24 are electrically connected by metal vias to pads on the bottom of the submount so the submount can be surface mounted to metal pads on a flexible circuit 28 or printed circuit board. The flexible circuit 28 comprises a very thin polymer insulator with printed metal traces ultimately connected to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and the power supply, and provides heat sinking Submounts are well known.

To cause the LED 10 to have a very low profile, and to prevent light from being absorbed by the growth substrate, the growth substrate is removed, such as by CMP or using a laser lift-off method, where a laser heats the interface of the GaN and growth substrate to create a high-pressure gas that pushes the substrate away from the GaN. In one embodiment, removal of the growth substrate is performed after an array of LEDs are mounted on a submount wafer and prior to the LEDs/submounts being singulated (e.g., by sawing).

After the growth substrate is removed, a planar phosphor layer 30 is positioned over the top of the LED for wavelength-converting the blue light emitted from the active layer 14. The phosphor layer 30 may be preformed as a ceramic sheet and affixed to the LED layers, or the phosphor particles may be thin-film deposited, such as by electrophoresis. The phosphor ceramic sheet may be sintered phosphor particles or phosphor particles in a transparent or translucent binder, which may be organic or inorganic. The light emitted by the phosphor layer 30, when mixed with blue light, creates white light or another desired color. The phosphor may be a YAG phosphor that produces yellow light (Y+B=white), or may be a red and green phosphor (R+G+B=white).

With a YAG phosphor (i.e., Ce:YAG), the color temperature of the white light depends largely on the Ce doping in the phosphor as well as the thickness of the phosphor layer 30.

A reflective film 32 is then formed over the phosphor layer 30. The reflective film 32 may be specular or diffusing. A specular reflector may be a distributed Bragg reflector (DBR) formed of organic or inorganic layers. The specular reflector may also be a layer of aluminum or other reflective metal, or a combination of DBR and metal, or titanium oxide particles in a solgel solution. A diffusing reflector may be formed of a metal deposited on a roughed surface or a diffusing material such as a suitable white paint. The phosphor layer 30 also helps to diffuse the light to improve light extraction efficiency.

Although side-emitting lenses are sometimes used to divert all light emitted by an LED's top surface into a circular side-emission pattern, such lenses are many times the thickness of the LED itself and would not be suitable for an ultrathin backlight.

In a non-preferred embodiment of a side-emitting LED (not shown), two mirror layers (e.g., reflective films) are formed over opposite sides of the phosphor layer, perpendicular to the semiconductor LED layers, to sandwich the phosphor layer. The LED would then be positioned within a lightguide such that the major face of the LED semiconductor layers is perpendicular to the top and bottom surfaces of the lightguide, with the mirror surfaces being parallel with the top and bottom surfaces of the lightguide. Light then exits the three open sides of the phosphor layer generally parallel to the mirror layers to enter the backlight lightguide.

Any LED that emits most of its light within a low height/area or within a narrow or restricted angle between the top and bottom surfaces of the backlight lightguide is considered a side-emitting LED in this disclosure. If the reflective layer(s) on the LED are very thin, some light may leak through the reflective layer(s); however, this leakage is typically less than 10%. A suitable side-emitting LED may even be an LED having a lens that redirects the light primarily within the plane of the lightguide. The lens may use total internal reflection, collimation optics, or any other technique.

Figure 1B:
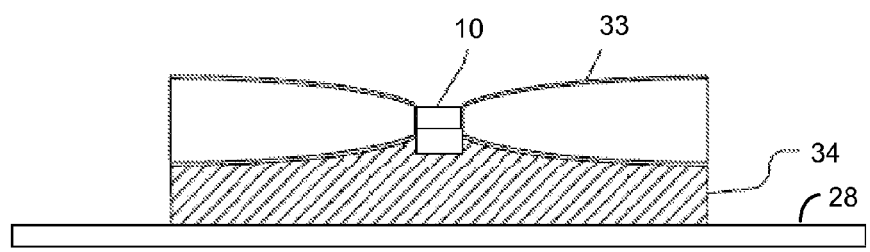
FIG. 1B illustrates the side-emitting LED of FIG. 1A with collimation optics.

FIG. 1B illustrates a side-emitting LED 10 that includes collimation optics 33. A support surface 34 may support the optics 33. The collimation optics 33 collimate the light before the light enters the lightguide. In another embodiment, a Fresnel lens may be formed on a side of the LED for collimating the light.

Processing of the LED semiconductor layers may occur before or after the LED is mounted on the submount 22.

In one embodiment, the submount 22 has a thickness of about 380 microns, the semiconductor layers have a combined thickness of about 5 microns, the phosphor layer 30 has a thickness of about 200-300 microns, and the reflective film 32 has a thickness of about 100 microns, so that the LED plus the submount is less than 1 mm thick. Of course, the LED 10 can be made thicker. The length of each side of the LED is typically less than 1 mm.

If the LED need not be ultra-thin, the efficiency of the side emission may be increased by adding a clear lightguiding layer over the n-layer 12, a scattering layer over the phosphor layer incorporating reflective particles or a roughed/prism surface, and a dichroic mirror or a one-way mirror (like a dichroic mirror) below the phosphor layer 30 so that the wavelength-converted light downwardly reflected by the reflective film 32 is not absorbed by the semiconductor layers.

Side-emitting flip-chip LEDs provide a number of advantages when used in lighting systems. In backlights, side-emitting flip chip LEDs allow utilization of thinner lightguides, fewer LEDs, better illumination uniformity, and higher efficiency due to better coupling of light into a lightguide.

Figure 2:
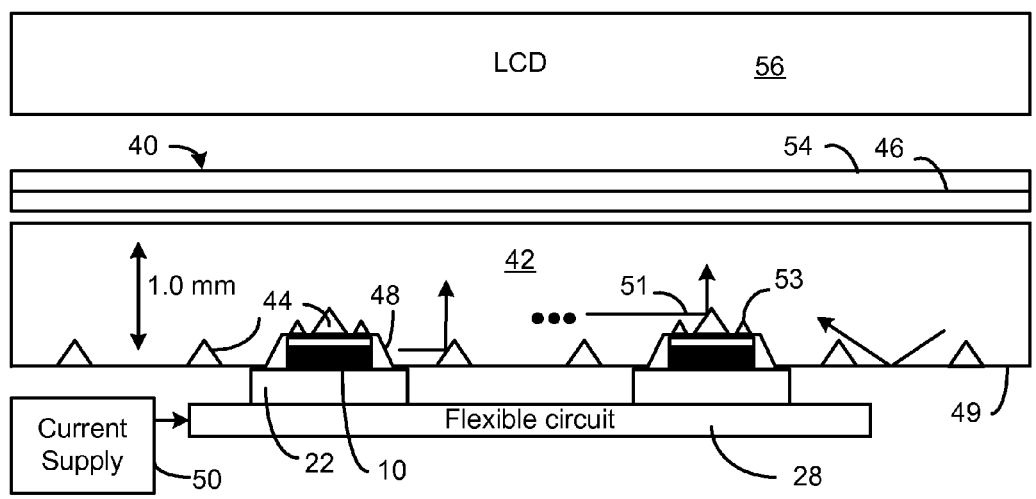
FIG. 2 is a partial cross-sectional view of a backlight cut through the LEDs in accordance with an embodiment of the invention. Also shown is an LCD panel separated from the backlight.
Figure 3:
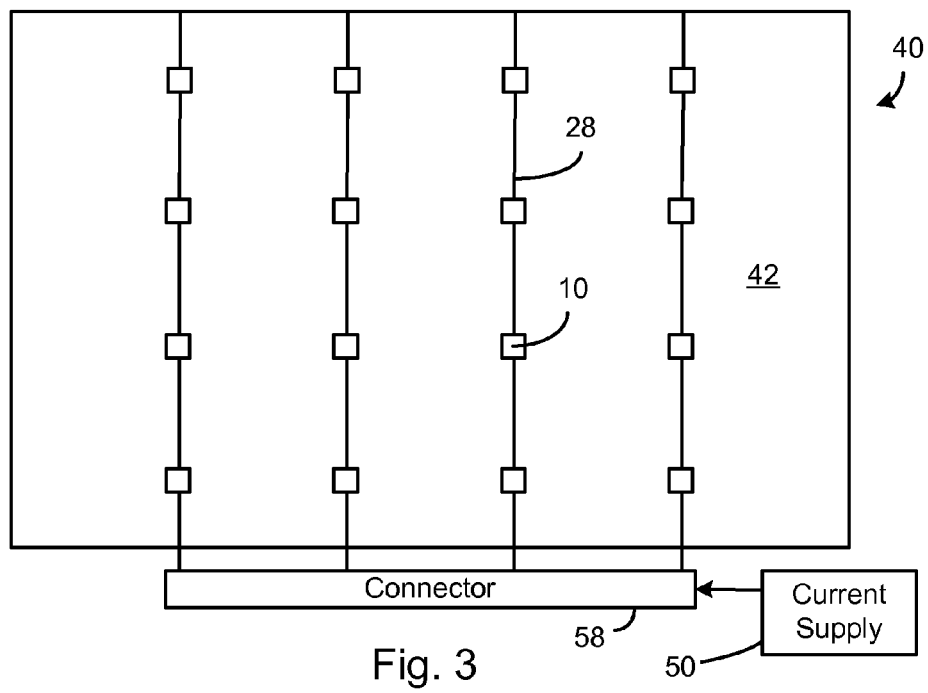
FIG. 3 is a top down view of the backlight of FIG. 2, showing additional LEDs.

FIG. 2 is a partial cross-sectional view of a backlight 40 using the LEDs 10 and cut across two LEDs 10. FIG. 3 is a top down view of the full backlight 40.

A polymer sheet (e.g., PMMA) forms a transparent lightguide 42. In one embodiment, the thickness of the lightguide 42 is 1-2 mm so that it is flexible and can be rolled up. In another embodiment, the lightguide 42 is up to 10 mm thick for larger backlight applications to increase the light mixing for improved color and brightness uniformity across the backlight.

Molded into the bottom surface of the lightguide are prisms 44 that reflect light upward toward the top of the lightguide 42. Instead of prisms, other surface shapes may be formed that redirect light upwards, such as a random roughening of the bottom surface by etching or sandblasting to form pits. The distribution of the prisms 44 is such that the upward light, when diffused by a thin diffuser sheet 46, creates a suitably uniform light emission across the light output surface of the backlight 40. The diffuser sheet 46 may be positioned directly on the lightguide 42 or separated from the lightguide 42.

Indentations 48 (or holes or openings) are also molded into the bottom of the lightguide 42 in which are inserted the side-emitting LEDs 10. The submounts 22 do not need to be inserted into the indentations 48, so the indentations 48 can be very shallow, such as 0.3-0.5 mm. If the submount has about the same dimensions as the LED, the indentions 48 can be made deeper, and the LED and at least a portion of the submount may be fitted within an indentation 48. This may increase the incoupling efficiency into the lightguide.

Since the side-emitting LEDs 10 emit little upward light, a prism 44 (or other reflector) is also molded into the top wall of the indentations 48 so that the light emission over an indentation area appears no different from any other area of the backlight 40. Without the prism 44 over the LED 10, LED area could appear as a dark spot at the output of the backlight 40.

The indentions 48 may have vertical or angled sidewalls.

A reflective film 49 may be formed or placed over the back surface of the lightguide 42 and side surfaces to reflect all light back into the lightguide 42 and generally towards the top surface. The film 49 may be Enhanced Specular Reflector (ESR) film available from 3M Corporation. Alternatively, the backlight 40 is positioned in a shallow reflective tub for reflecting all light back into the lightguide 42 and for providing structural support when assembling the LCD. The reflective box may also align the LCD panel over the backlight. The reflector may be specular or diffusing.

Various light rays 51 are shown, illustrating the general principle of upward reflection of the side emission from the LEDs by the prisms 44 and reflective bottom surface. The side-emissions from all the LEDs mix together within the lightguide 42, and the mixed light leaks out through the top surface of the backlight 40 for a uniform emission across the output surface of the backlight 40 (which includes the diffuser sheet 46).

If the reflective film 32 is very thin, some light will leak through the reflective film 32. Generally, for a side-emitting LED, less than 10% of the light leaks through the reflector. In order to prevent such leakage being seen as a light dot at the top surface of the backlight, the top wall of the indentations 48 may have light scattering features 53, such as by molding in small prisms, scallop shaping, roughening, or providing light absorbing areas. Thereby, any upward light from the LED through the reflective film 32 will be spread out and not be noticeable. In addition, the diffuser sheet 46 can be patterned and optimized to compensate for any non-uniformities in the light extracted from the lightguide.

The LEDs 10 may be electrically connected together and connected to a current supply 50 using a flexible circuit 28. Such a flexible circuit 28 comprises a thin insulating sheet or ribbon with metal traces terminating in a connector. The metal traces may interconnect the LEDS in series and/or parallel. The flexible circuit may be adhesively affixed to the bottom surface of the lightguide 42 for fixing the LEDs in place, and/or the LEDs may be separately adhesively secured within each indentation 48 using silicone or any other suitable adhesive.

The flexible circuits 28 should provide adequate heat conduction between the LEDs and a heat sinking surface on which the backlight is positioned when assembling the LCD.

One or more thin brightness enhancement films (BEF) 54 are positioned over the diffuser sheet 46 for directing the diffused light within a certain viewing angle for increasing the brightness within that angle.

A conventional liquid display panel 56 is then positioned over the backlight 40 to create an LCD for displaying color images. The LCD can produce color images using pixel shutters (e.g., a liquid crystal layer in combination with a TFT array), polarizers, and RGB filters. Such LCD panels are well known.

FIG. 3 is a top view of the backlight 40 illustrating an array of 16 LEDs, where each column of LEDs is connected together in series by a flexible circuit 28. Alternatively, all the LEDs 10 may be interconnected by a single flexible circuit sheet in series and/or parallel. The flexible circuit conductors may be terminated with a connector 58 and connected to a current supply 50. The lightguide 42 is either mounted in a reflective tub, or reflective foil surrounds the back and side surfaces.

In one embodiment, each LED emits white light. In another embodiment, there are red, green, and blue emitting LEDs distributed around the backlight whose light is mixed in the lightguide to create white light.

Figure 4:
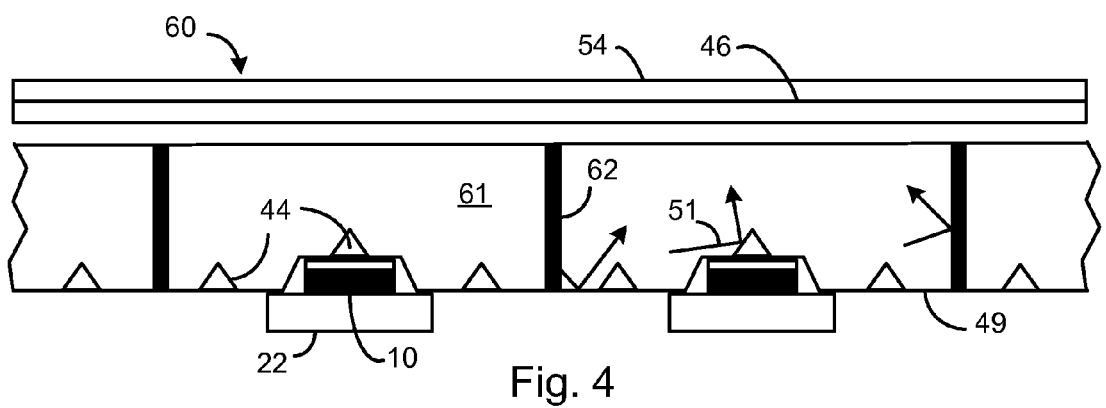
FIG. 4 is a partial cross-sectional view of a backlight cut through the LEDs where the backlight is divided into cells, in accordance with another embodiment of the invention.

FIG. 4 is a partial cross-sectional view of another type of backlight 60, where each LED 10 is located in an optical cell 61. The cell walls 62 are diffusively reflective, or translucent, so that almost all light emitted by an LED within a cell is emitted only by that cell. In another embodiment, the cell walls are specular. The cell walls 62 may be formed in various ways, such as by separately forming the lightguide cells and adhesively securing the cells to the diffuser sheet 46 or to the reflective foil 49 with the cell wall material in-between the cells, or by molding the lightguide to have wall openings and filling the openings with a white diffusing material, or by forming the walls at the same time as forming the transparent portions of the lightguide, or by creating a support structure having the walls and then forming the lightguide layer over the support structure and walls, or by forming the walls using any other suitable means. The walls may even be formed by molding a large reflective prism around each LED cell. By forming each cell identically, each cell will output the same light to form a very uniform light emission after diffusion by the diffuser sheet 46.

In a variation of FIG. 4, there are multiple LEDs within each cell, and the light from the multiple LEDs mix within the cell. There may be 2, 3, 4, or more LEDs per cell.

Figure 5:
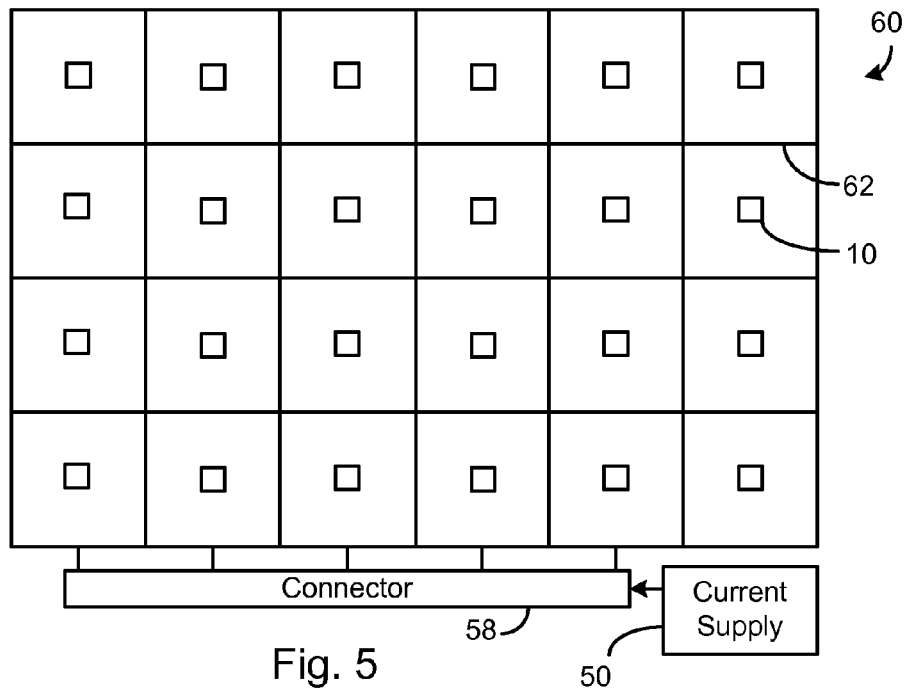
FIG. 5 is a top down view of the backlight of FIG. 4, showing additional LEDs.

FIG. 5 is a top down view of the backlight 60 of FIG. 4, with the LEDs 10 electrically coupled to a current supply 50 using a flexible circuit and connector 58.

Figure 6:
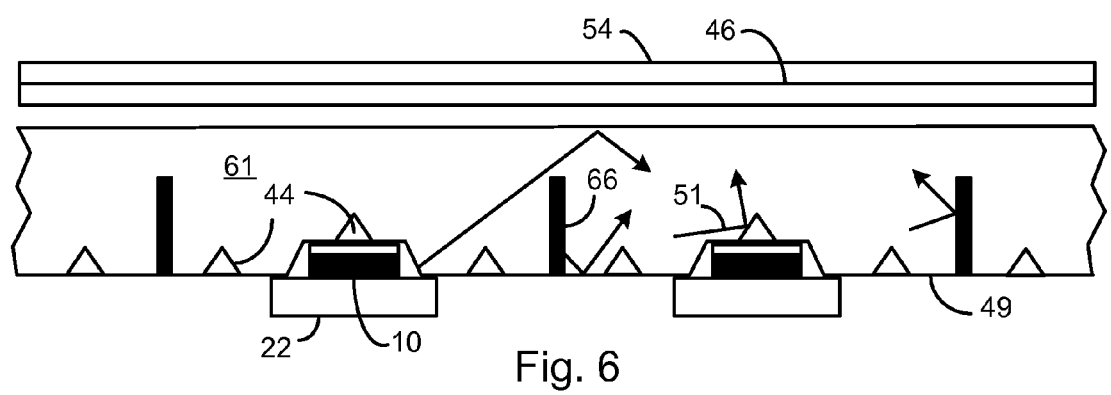
FIG. 6 is a partial cross-sectional view of a backlight cut through the LEDs where the backlight cell walls do not completely extend between the top and bottom surfaces of the backlight, in accordance with another embodiment of the invention.

FIG. 6 illustrates a variation of the backlight of FIG. 4, where the walls 66 extend only partially through the lightguide 61 thickness. In this embodiment, there is much more mixing of light from LEDs in different cells since some light passes over the walls into different cell areas. As in all embodiments, the diffuser sheet 46 may be patterned to optimize the brightness uniformity across the backlight.

Figure 7:
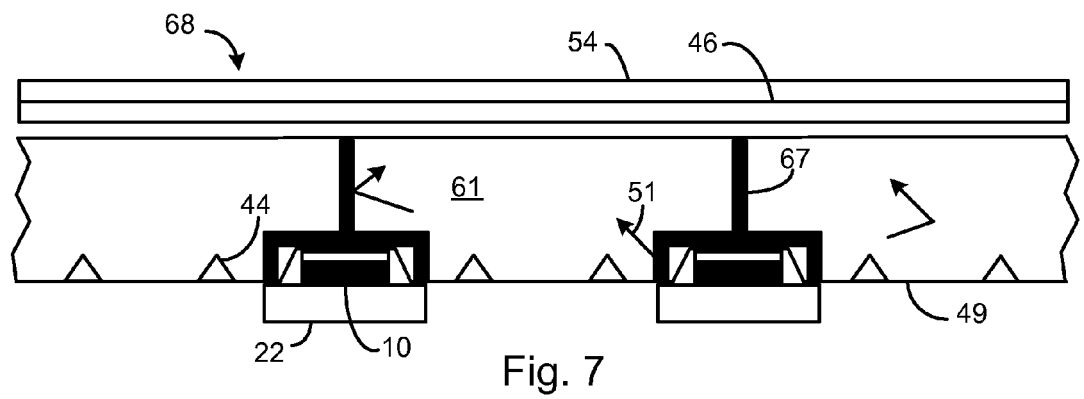
FIG. 7 is a partial cross-sectional view of a backlight cut through the LEDs where the LEDs are in line with the backlight cell walls so that light from each LED is divided amongst two cells, in accordance with another embodiment of the invention.

FIG. 7 illustrates another variation of the backlight of FIG. 4, where the LEDs are in line with the cell walls 67. The cell walls may extend around each LED so that the light from each LED is divided between adjacent cells.

Figure 8:
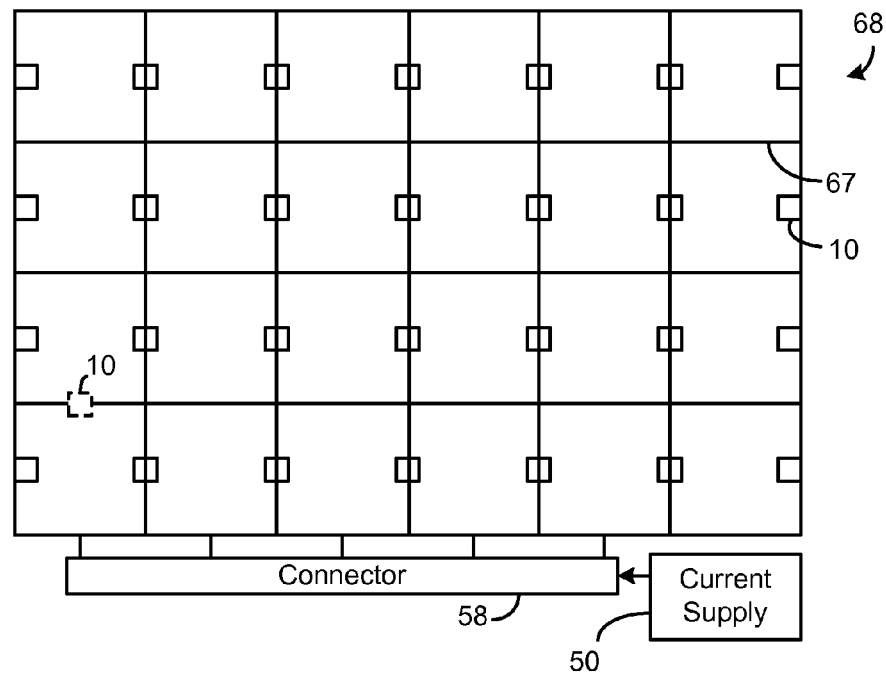
FIG. 8 is a top down view of the backlight of FIG. 7, showing additional LEDs, where the LEDs can be optionally individually addressed.

FIG. 8 is a top down view of the backlight 68 of FIG. 7, with the LEDs 10 electrically coupled to a current supply 50 using a flexible circuit and connector 58. The edge LEDs 10 may be smaller since their light is not divided between cells, or the areas of the edge cells may be made smaller. Additional LEDs may be in line with the horizontally drawn cell walls to provide light from four LEDs to each cell. A single LED 10 (for simplicity) is shown in dashed outline in line with a horizontal wall. This improves color uniformity since the color temperatures of LEDs slightly vary, and the combined light from a plurality of LEDs averages the color temperature.

In one embodiment, there may be five LEDs per cell, four in line with the four cell walls and one in the center of a cell. In all embodiments, the size of a cell may be dependent on the desired brightness of a cell and the number of LEDs in a cell. The cells may be modular so that a larger backlight may be formed by simply adding cells without concern of how the additional cells will affect the rest of the backlight.

The LEDs may be connected is a combination of serial and parallel to obtain the desired voltage drop. In another embodiment, the individual LEDs making up the backlight or each group of LEDs in a cell may be separately controlled to optimize the brightness uniformity.

FIG. 9 is a top down view of a portion of a backlight, similar to FIGS. 7 and 8, but where the LEDs 10 are located at the corners of the cell walls 70. Thus, each LED contributes light to four adjacent cells. An additional LED 10 (shown in dashed outline) may be positioned in the middle of each cell for additional brightness or better uniformity. The LEDs at the edges of the backlights may be smaller so that the edge cells have the same brightness as the other cells, or the cells may have a smaller area.

FIG. 10 is a cross-section of the edges of two abutting cells, or segment, in any of the described backlights, such as those shown in FIGS. 5, 8, and 9. Instead of the edges of a cell being vertical walls, the edges 72 may be angled to reflect light 73 (by TIR) upward toward the output surface 74 of the lightguide 75. The upper part of each edge is vertical.

FIG. 11 is similar to FIG. 10 but shows the angled edges 76 extending all the way to the top of the lightguide 77. The angles of the edges may be optimized to provide the best uniformity of light across each cell or allow only a controlled amount of light to pass between neighboring cells, where the angle controls the amount of totally internally reflected light versus light that leaks through and/or gets reflected by the bottom mirror into the neighboring cell.

Figure 12:
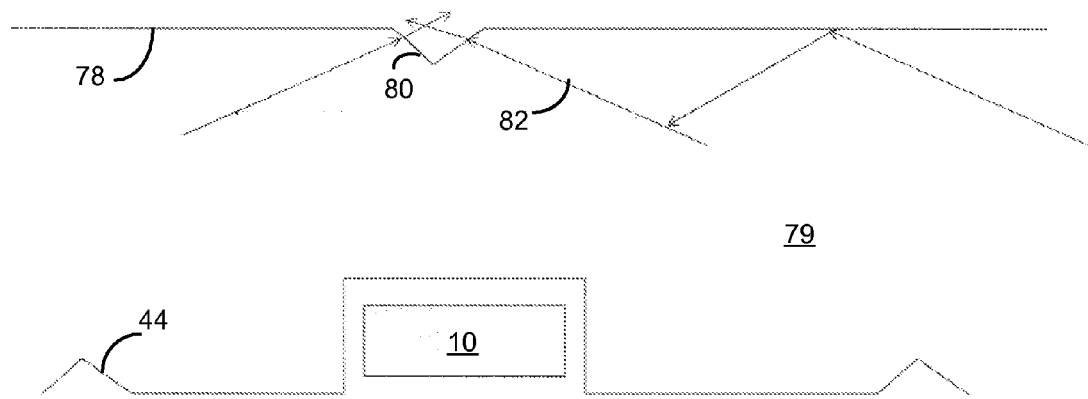
FIG. 12 illustrates how the top surface of the lightguide may have optical features, such as prism-shaped indents, that increase the light extraction over a side-emitting LED so that there is no dark spot over the LED.

FIG. 12 illustrates how the top surface 78 of the lightguide 79 may have optical features 80, such as prisms, hip roofs (i.e., a shape with four flat sloping sides), cones, spheres, ellipsoids, pyramids, holes, bumps, or variations thereof, that increase the light extraction over a side-emitting LED 10 so that there is no dark spot over the LED. FIG. 12 shows light rays 82, at a shallow angle to the top surface of the lightguide, that would normally reflect back into the lightguide. However, due to the angled indent 79, the light ray 82 is emitted over the LED to improve the uniformity of brightness across the entire lightguide.

Figure 13:
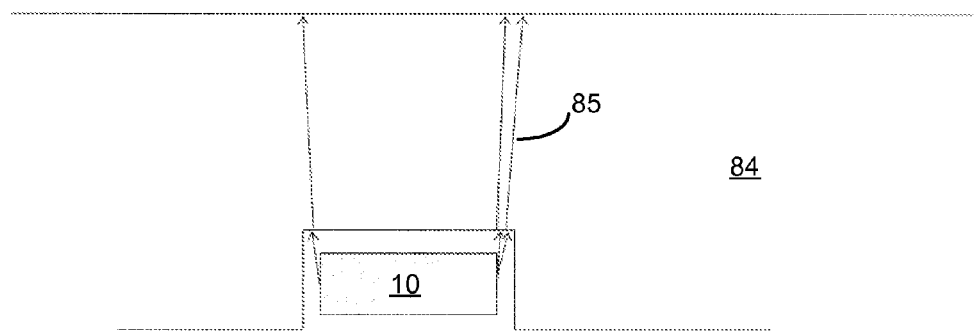
FIG. 13 illustrates a potential problem with a bright pattern from the side-emitting LED appearing at the output of the lightguide due to some of the side-emitting LED light being emitted upward.

FIG. 13 illustrates a potential problem with a bright pattern from the side-emitting LED 10 appearing at the output of the lightguide 84 due to some of the side-emitting LED light 85 being emitted upward.

Figure 14:
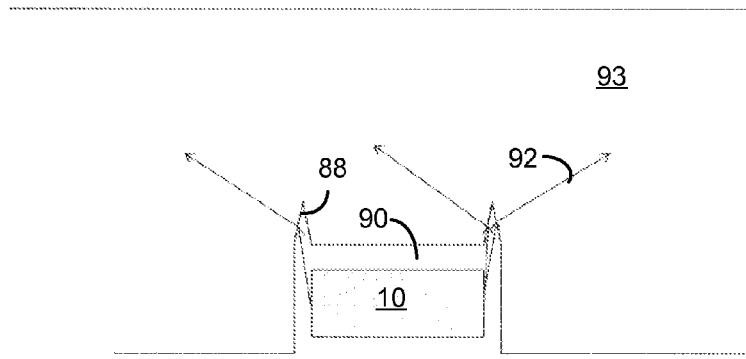
FIG. 14 illustrates a fix to the problem of FIG. 13 where refraction features are located at the top edges of the lightguide indent for the side-emitting LED.

FIG. 14 illustrates a fix to the problem of FIG. 13 where refraction features 88 are formed near the top edges of the lightguide indent 90 for the side-emitting LED 10. The upward light 92 emitted from the sides of the LED 10 is directed away from above the LED 10 to prevent bright areas around the LED. This improves the uniformity of light emitted by lightguide 93, which is an efficient alternative to absorbing the light with an absorbing material.

Figure 15:
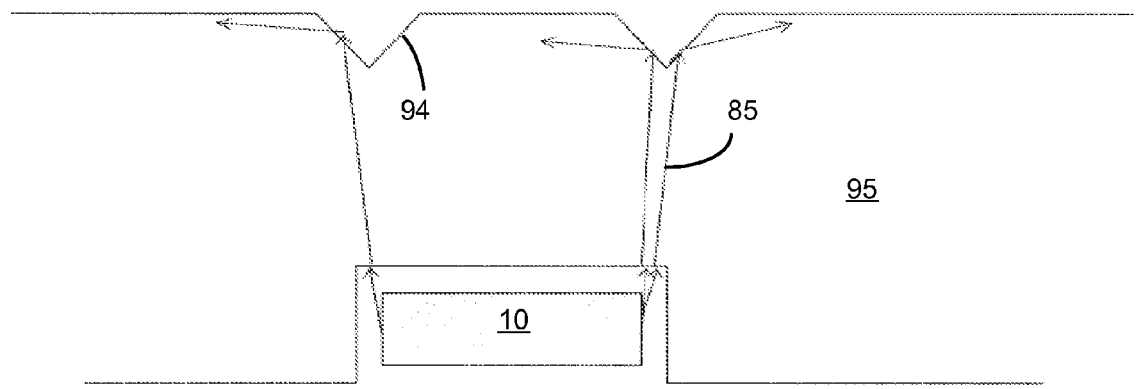
FIG. 15 illustrates another fix to the problem of FIG. 13, where total internal reflection (TIR) features are formed on the output surface of the lightguide.

FIG. 15 illustrates another fix to the problem of FIG. 13, where total internal reflection (TIR) features 94 are formed on the output surface of the lightguide 95 to prevent bright areas around the LED.

Figure 16:
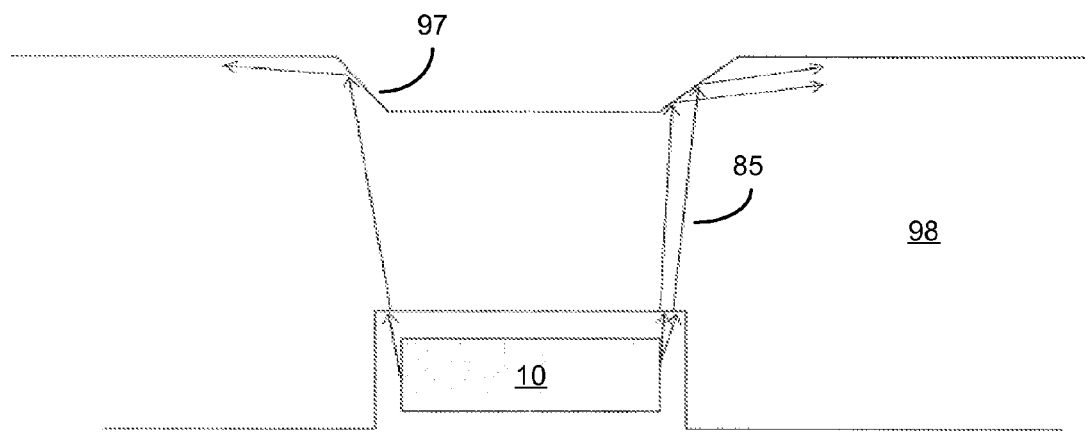
FIG. 16 illustrates a variation of the TIR features of FIG. 15.

FIG. 16 illustrates a variation of the TIR features of FIG. 15, where TIR features 97 are formed on the output surface of the lightguide 98 to prevent bright areas around the LED 10.

Any of the lightguide features described herein may be combined into a single lightguide.

Figure 17:
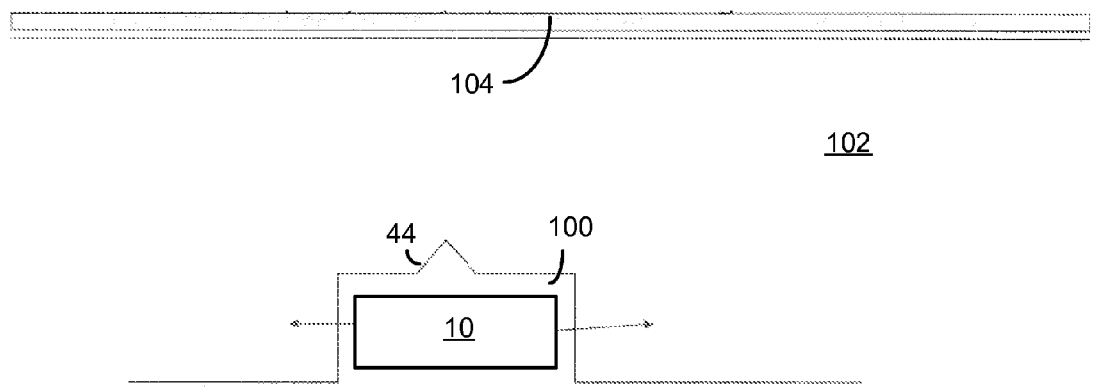
FIG. 17 illustrates a blue light side-emitting LED within an indent in the bottom of a lightguide, with a white light phosphor layer (e.g., YAG) over the output surface of the lightguide so that the emitted light is white.

FIG. 17 illustrates a blue light side-emitting LED 10 within an indent 100 in the bottom of a lightguide 102, with a white light phosphor layer 104 over the output surface of the lightguide so that the emitted light is white. A YAG phosphor layer 104 emits yellow-green light when energized by blue light, and the combination of the converted light and the blue light leaking through creates white light. The phosphor layer 104 may also be a combination of red and green phosphors to create white light. The LED 10 may also emit UV, and the phosphor layer 104 may include blue, green, and red phosphors to create white light.

Figure 18:
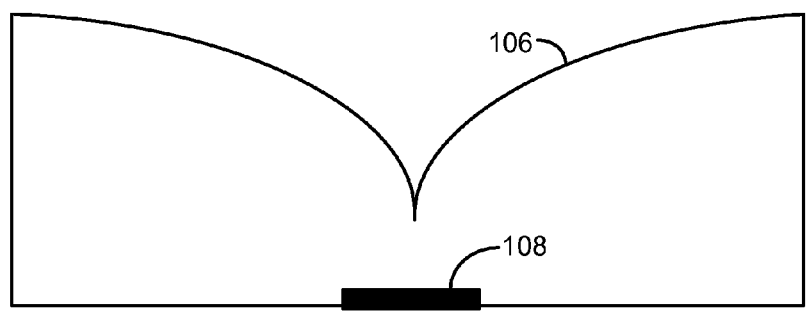
FIG. 18 is a cross-sectional view of side-emitting lens shape, which is symmetrical around a central axis, that may be used instead of a metal reflector layer over the semiconductor LED.

In the various embodiments, the side-emission is created by a reflective layer (e.g., metal) over the LED die. However, side-emission may be created by forming a side-emitting lens over the LED that uses TIR to redirect the LED light. FIG. 18 is a cross-sectional view of side-emitting lens 106, which is symmetrical around a central axis, that may be used instead of a reflector layer over the semiconductor LED 108. The LED 108 is about 0.63 mm wide, and the lens 106 has a diameter of about 5 mm and a height of about 2.25 mm. Using a side-emitting lens greatly limits the minimum thickness of a backlight.

Various other types of side-emitting LEDs may be use in conjunction with the inventive backlight, where the backlight avoids dark spots and bright spots by having optical features formed in the lightguide so that the LED areas appear essentially the same as the non-LED areas.

In all the embodiments, the optical features that are molded into the lightguide to scatter the light may be instead be scattering reflectors that are deposited over the lightguide surface at approximately the same positions as the indented features shown in the figures.

Such scattering (diffusing) reflectors may be a white pigment, such as a suitable white paint, or a metal, or other material. Such material may be deposited using any suitable means, such as screen-printing, sputtering, evaporation, or other means.

All the embodiments of the lightguides may be used to backlight an LCD or used for general purpose lighting where a thin lighting source is desired.

Figure 19:
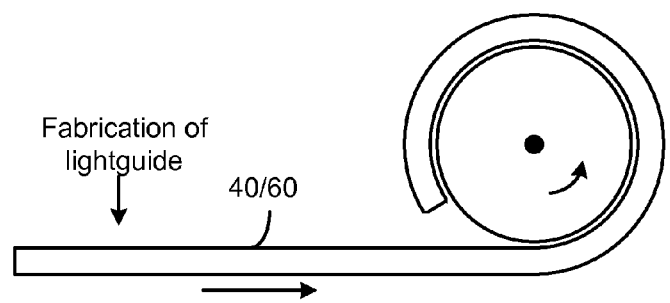
FIG. 19 illustrates how the lightguide may be rolled after fabrication for ease of handling.

Since the backlights of FIGS. 2-17, containing the LEDs 10, may be on the order of 1 mm thick, the backlights may be fabricated using a process that ultimately rolls the backlight into a continuous roll, as shown in FIG. 19. In one embodiment, the diffuser sheet 46 and BEF 54 are also affixed to the backlight and rolled. However, in the preferred embodiment, the diffuser sheet 46 and BEF 54 are affixed after the backlight is unrolled to avoid delamination. For assembly of the LCD, the manufacturer of the LCD may cut the backlight to the desired length and width for a single LCD. The backlight and LCD panel are then assembled.

Additionally, in some applications, a flexible LCD is desired, and the flexibility of the backlight enables the flexible feature of the final LCD.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light emitting device comprising:
a backlight portion comprising:
a plurality of side-emitting, non-lasing light emitting diodes (LED) emitting white light, each LED having an active layer that emits light, each LED emitting a majority of light from its sides, wherein the sides of each LED are substantially perpendicular to the active layer;
a lightguide having an output surface through which light is emitted, each LED being positioned within an opening in the lightguide so as to optically couple light into the lightguide, the lightguide being formed of a solid transparent material; and
cellular walls within the lightguide at least partially surrounding one or more LEDs, each cellular wall being at least partially reflective, wherein the cellular walls create a plurality of cells in the lightguide, a light output from each cell being substantially the same, the cellular walls being configured for limiting mixing of light from other ones of the LEDs; and
a display panel portion comprising:
a liquid crystal display (LCD) positioned over the backlight for selectively controlling passing of light from the backlight through pixel locations in the LCD.

2. The device of claim 1 wherein the cellular walls are diffusively reflective.

3. The device of claim 1 wherein the cellular walls are translucent.

4. The device of claim 1 wherein the cell walls are angled to redirect light to the output surface of the lightguide.

5. The device of claim 1 wherein at least some of the LEDs are in line with a cellular wall such that light from LEDs is divided between two or more cells.

6. The device of claim 1 wherein at least some of the LEDs are each in line with two cellular walls that are perpendicular to each other so as to be positioned at a location where the two cellular walls would have intersected.

7. The device of claim 1 wherein the cells are modular such that cells may be added to increase a size of the light emitting device.

8. The device of claim 1 wherein the light output of each of the LEDs is individually controllable.

9. The device of claim 1 where the light output of each cell is separately controllable.

10. The device of claim 1 wherein the cellular walls extend between top and bottom surfaces of the lightguide.

11. The device of claim 1 wherein the cellular walls extend only part way between top and bottom surfaces of the lightguide.

* * * * *